United States Patent [19]

Nishikawa et al.

[11] 4,325,035
[45] Apr. 13, 1982

[54] OSCILLATOR USING DIELECTRIC RESONATOR

[75] Inventors: Toshio Nishikawa, Nagaokakyo; Yoji Ito, Takatsuki; Youhei Ishikawa; Sadahiro Tamura, both of Kyoto, all of Japan

[73] Assignee: Murata Manufacturing Co., Ltd., Japan

[21] Appl. No.: 123,061

[22] Filed: Feb. 20, 1980

[30] Foreign Application Priority Data

Mar. 1, 1979 [JP] Japan ............................ 54/24751

[51] Int. Cl.³ ............................................ H03B 5/18
[52] U.S. Cl. .................................. 331/96; 331/117 D
[58] Field of Search ............ 331/96, 107 DP, 107 SL, 331/107 C, 117 D; 333/219, 227, 230, 231, 232, 233

[56] References Cited

U.S. PATENT DOCUMENTS 4,079,341 3/1978 Linn et al. .............................. 331/96
4,149,127 4/1979 Murakami et al. ..................... 331/96
4,187,476 2/1980 Shinkawa et al. ............... 331/117 D

FOREIGN PATENT DOCUMENTS 54-12553 1/1979 Japan ............................ 331/107 SL

OTHER PUBLICATIONS

Van Degrift, "A Sensitive Displacement Transducer Using an Extremely Reentrant 84MHz Cavity Oscillator", Rev. Sci. Instrum., Sep. 1974, pp. 1171–1172.

Primary Examiner—Siegfried H. Grimm

[57] ABSTRACT

A dielectric resonator is housed within an internal space of a metallic casing. An amplifier is disposed outside the space and an input and output circuits are connected to the amplifier. An output coupling window is formed in the casing at the position corresponding to the output circuit of the amplifier and an input coupling window is formed in the casing at the position corresponding to the input circuit of the amplifier. An electromagnetic wave leaking from the output circuit of the amplifier is coupled through the output coupling window to the dielectric resonator and the dielectric resonator is further coupled to the input circuit of the amplifier through the input coupling window.

30 Claims, 16 Drawing Figures

U.S. Patent    Apr. 13, 1982    Sheet 1 of 4    4,325,035
FIG. 1
PRIOR ART
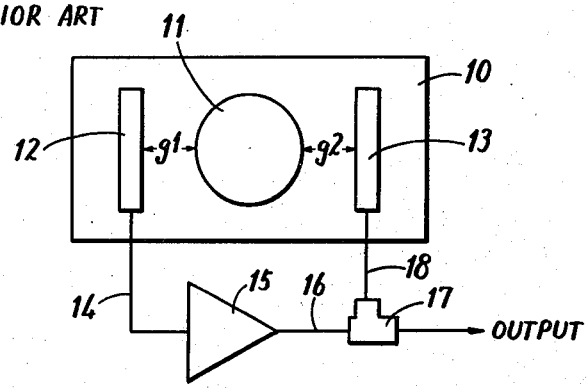
FIG. 2A
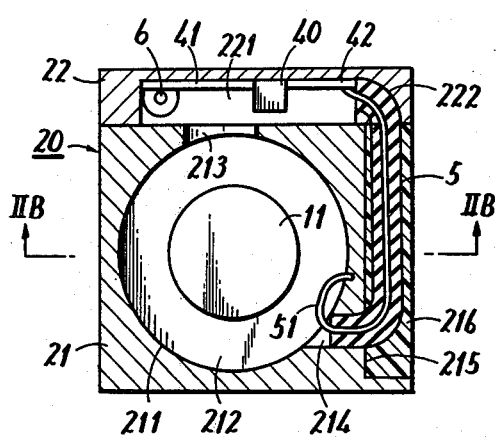
FIG. 2B

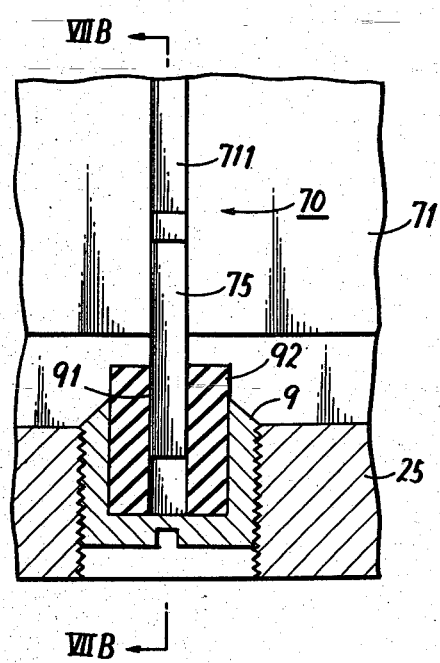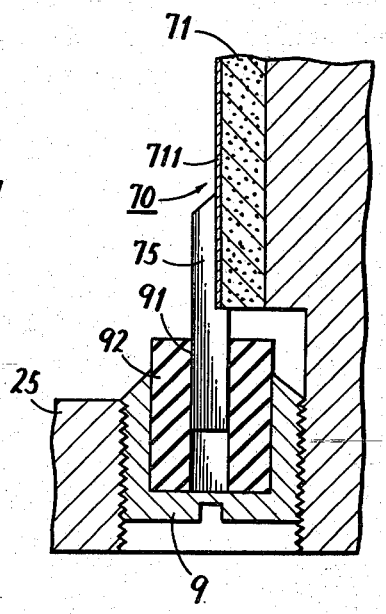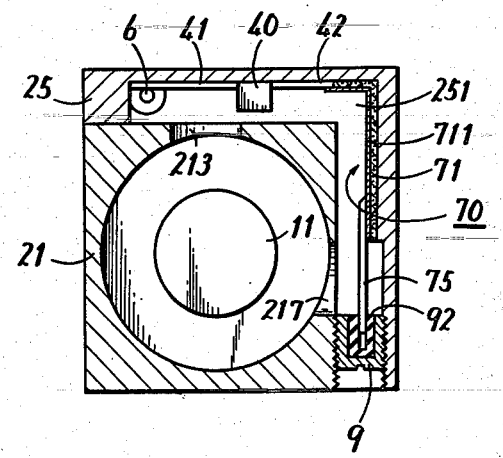

OSCILLATOR USING DIELECTRIC RESONATOR

BACKGROUND OF THE INVENTION

1. Field of the Invention

The present invention relates to an oscillator using a dielectric resonator. More specifically, the present invention relates to a microwave oscillator using a dielectric resonator in a feedback loop of an amplifier.

2. Description of the Prior Art

An oscillator may be provided by forming a positive feedback loop between a drain circuit and a source circuit, for example, in an amplifying element such as a field effect transistor. Of late, an oscillator using a dielectric resonator as a feedback loop has been proposed and has been put into practical use by virtue of its excellent frequency stability. Such a microwave oscillator using a dielectric resonator is disclosed in, for example, U.S. Pat. No. 4,079,341 issued Mar. 14, 1978 to Donald Floyd Linn et at and entitled "MICROWAVE OSCILLATOR HAVING FEEDBACK COUPLED THROUGH A DIELECTRIC RESONATOR". Another disclosure of interest in this connection is also set forth in IEEE TRANSACTIONS ON MICROWAVE THEORY AND TECHNIQUES, March, 1978, Vol. MTT-26, No. 3, entitled "A Highly Stabilized Low-Noise GaAs FET Integrated Oscillator with a Dielectric Resonator in the C Band". Microwave oscillators such as those disclosed in the above referenced U.S. patent and the above referenced paper employ a positive feedback loop implemented by a dielectric resonator coupled between the output and input of an amplifying element.

FIG. 1 is a view explaining a fundamental concept of a microwave oscillator employing a dielectric resonator as a positive feedback loop. Referring to FIG. 1, a dielectric resonator 11 is disposed within a casing 10 and a pair of exciting bars 12 and 13 are also housed in the casing 10 so as to be opposed to each other with the dielectric resonator 11 disposed therebetween. One exciting bar 12 is coupled to a coaxial cable 14, for example, through a connector, not shown. The coaxial cable 14 is connected to the input of an amplifier 15. The output of the amplifier 15 is connected by means of a coaxial cable 16 to a coaxial directional coupler or an RF monitor tee 17 as an example of a T type branch. A portion of the output of the amplifier 15 is withdrawn from the RF monitor tee 17 as a high frequency signal output of the oscillator. A portion of the output of the RF monitor tee 17 is also applied to a coaxial cable 18, which is connected to the other exciting bar 13 through a connector, not shown. With such an oscillator structure, a portion of the high frequency signal output of the amplifier 15 forms a positive feedback to the input of the amplifier 15 through the dielectric resonator 11, thereby causing oscillation. The phase of the high frequency signal fedback to the input of the amplifier 15 is determined as a function of a phase difference between the exciting bars 12 and 13, the lengths of the coaxial cables 14, 16 and 18 and a phase difference between the input and output of the amplifier 15. The respective coupling coefficients between the exciting bar 12 and the dielectric resonator 11 and the exciting bar 13 and the dielectric resonator 11 are determined as a function of a gap g1 between the dielectric resonator 11 and the exciting bar 12 and a gap g2 between the dielectric resonator 11 and the exciting bar 13, respectively. Accordingly, when adjusting the phase by changing the amplification of the amplifier 15, the oscillation frequency and the like, it is necessary to change the lengths of the coaxial cables 14, 16 and 18 included in the feedback loop. Furthermore, in adjusting an attenuation degree of the feedback loop, it is necessary to change the gaps g1 and g2 between the exciting bars 12 and 13 and the dielectric resonator 11, which further necessitates a change in the size of the casing 10. In addition, since the dielectric resonator 11, the coaxial cables 14, 16 and 18 and the amplifier 15 are implemented as separate blocks, the size of the oscillator is increased. Furthermore, a coaxial directional coupler, an RF monitor tee or the like 17 is required in order to withdraw a portion of the high frequency signal output of the amplifier 15 for the purpose removing the feedback signal. However, when the feedback signal is withdrawn by such an RF monitor tee, the feedback gain is attenuated by approximately 10 to 20 dB, which necessitates an increase in the gain of the amplifier 15.

SUMMARY OF THE INVENTION

For the purpose of eliminating the above described problems and disadvantages, the present invention employs a novel structure of an oscillator using a dielectric resonator, wherein a cavity is formed by a cavity wall and a dielectric resonator is disposed within the cavity while an amplifier is provided outside the cavity wall, with the input and output of the amplifier being coupled to the dielectric resonator so as to form a positive feedback loop through an electromagnetic wave path formed in the cavity wall.

According to the present invention, the gain of the feedback loop can be adjusted simply by controlling the amount of the electromagnetic wave propagating through the electromagnetic wave path formed in the cavity wall and therefore any necessity of changing the dimensions of the cavity and other portions is precluded. Accordingly, even in manufacturing oscillators of different oscillation frequencies, for example, a cavity wall or a housing of substantially the same dimensions may be used, which is highly suited for production of a small number of each type of a large number of types of oscillators. Furthermore, in coupling the output of the amplifier and the dielectric resonator, it is not necessary to employ a directional coupler, a T type branch, an RF monitor tee or the like as conventionally employed. This eliminates the attenuation of the feedback signal and thereby eliminates a reduction of the gain in the feedback loop. As a result, the present invention can achieve a sufficient oscillation output with an amplifier having a relatively small gain.

In a preferred embodiment of the present invention, the electromagnetic propagating path formed at the output of the amplifier may be merely an aperture or a window formed in the cavity wall and accordingly a complicated expedient such a T type branch and the like as conventionally employed is not necessary, which simplifies a structure of the inventive oscillator.

In a further preferred embodiment of the present invention, the electromagnetic wave propagating path at the input of the amplifier may also comprise a stripline coupled to the output of the amplifier and an aperture or a window formed in the cavity wall between the stripline and the dielectric resonator. Accordingly, any connector such as conventionally used is not necessary to couple the dielectric resonator to the input of the amplifier, with the result that a small sized oscillator can be provided. Furthermore, by forming a variable static capacitance for phase adjustment in association with the stripline, the phase can be adjusted to be adaptable to an oscillating condition of the oscillator by varying the static capacitance. This eliminates the need to manually adjust the phase as is required in the conventional oscillator. In addition, since such a variable static capacitance can be implemented by means of for example, a screw, the structure of the oscillator is very simple and the size of the oscillator can be made very compact as compared with the conventional oscillators.

Accordingly, a principal object of the present invention is to provide an oscillator using a dielectric resonator, which is simple in structure.

Another object of the present invention is to provide an oscillator using a dielectric resonator, which can be made compact.

A further object of the present invention is to provide an oscillator using a dielectric resonator, wherein phase adjustment for adaptation to an oscillating condition of the oscillator can be made with ease.

Still a further object of the present invention is to provide an oscillator using a dielectric resonator suited for production of a smaller number of oscillators of an increased number of kinds.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view for depicting a concept of a conventional oscillator using a dielectric resonator, wherein the present invention can be advantageously employed;

FIG. 2A is an outline cross sectional view showing a structure of one embodiment of the present invention;

FIG. 2B is another cross sectional view of the FIG. 2A oscillator taken along the line IIB—IIB in FIG. 2A;

FIG. 7A is an enlarged view showing a major portion of a further embodiment of a phase adjusting means;

FIG. 7B is a view showing a cross section taken along the line VIIB—VIIB in FIG. 7A; and FIG. 8 is a view showing a cross section of still another embodiment of the present invention.

DESCRIPTION OF THE PREFERRED EMBODIMENTS

Figure 3A:
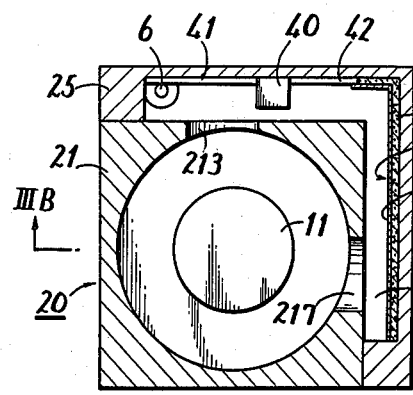
FIG. 3A is an outline cross sectional view of another embodiment of the present invention.

FIG. 2A is a view showing a transversal cross section of one embodiment of the present invention and FIG. 2B is a view showing another cross section taken along the line IIB—IIB in FIG. 2A. Referring to FIGS. 2A and 2B, a housing or casing 20 made of an electrically conductive material comprises a first casing portion 21 and a second casing portion 22 disposed outside the first casing portion 21. The first casing portion 21 comprises a metallic block of a rectangular parallelepiped in which a cavity or space 212 taking the form of a right circular cylinder is formed. The cavity 212 is defined by a cavity wall 211 and houses a dielectric resonator 11. The dielectric resonator 11 is disposed in the cavity 212 such that the dielectric resonator 11 is placed on a supporting base 31 made of an insulating material. An output coupling window 213 is formed in the cavity wall 211 at a portion facing a first side surface of the parallelepiped space for electromagnetically coupling the output of an amplifier 40 (described below) to the dielectric resonator 11. A penetration aperture 214, which allows the insertion of a coaxial cable 5 is formed in the cavity wall 211 at a second side surface of the parallelepiped space adjacent the first side surface of the parallelepiped where the output coupling window 213 is formed. A groove 215 is formed on the second side surface of the parallelepiped space of the first casing portion 21 defined by a wall plate laterally extending from the edges of the second side surface of the parallelepiped, except for the edge adjoining the first side surface.

The second casing portion 22 comprises a metallic box having a space or groove 221 formed therein and having an area or size commensurate with the first side surface of the first casing portion and the end surface of the wall plate formed on the second side surface of the first casing portion. The second casing portion 22 thus structured is connected to the first side surface of the first casing portion 21, so that a compartment is formed therebetween. A penetrating aperture 222 is formed in the second casing portion 22 at the end adjacent the second side surface for allowing insertion of the coaxial cable 5 while the same is bent at substantially a right angle. An amplifier 40 (implemented by, for example, a field effect transistor) is housed in the space or groove 221. The drain electrode of the field effect transistor 40 is connected to one end of an output matching circuit 41 and the other end of the output matching circuit 41 is connected to the output terminal 6. The gate electrode of the above described field effect transistor 40 is connected to an input matching circuit 42 and the source electrode of the field effect transistor 40 is connected to the ground through a parallel connection of a resistor and a capacitor, not shown. The coaxial cable 5 is housed in the groove 215 formed on the second side surface of the above described first casing portion 21 and both ends of the coaxial cable 5 are inserted through the penetrating aperture 214 formed in the first casing portion 21 and the penetrating aperture 222 formed in the second casing portion 22, while one end of the inner conductor of the coaxial cable 5 is connected to the above described input matching circuit 42. The other end of the inner conductor of the coaxial cable 5 extends to the vicinity of the dielectric resonator 11 of the cavity 212, thereby to form a coupling loop 51, while the tip end thereof is connected to the cavity wall 211. The upper portion of the cavity 212 is sealed with a lid 23.

The periphery of lid 23 is threaded and the upper portion of the cavity wall 211 is also threaded so that the lid 23 may be screwed into the casing portion 21. The resonance frequency of the dielectric resonator 11, and thus the oscillation frequency of the oscillator, can be varied by turning the lid 23, thereby effectively moving the dielectric resonator 11 toward or away from the lid 23. Preferably, a fine adjusting screw 24 may be provided at about the center of the lid 23 so that the oscillation frequency may be fine tuned. Furthermore, a resin layer 216 of such as epoxy resin may be filled in the groove 215 formed on the second side surface of the first casing portion 21.

With such a structure of the oscillator, the output of the field effect transistor 40 is withdrawn from the output terminal 6 through the output matching circuit 41. A stripline is provided at the output of the amplifier 40, and preferably between the output matching circuit 41 and the output terminal 6. A portion of a high frequency component of the output from the amplifier 40 is leaked from the stripline and is electromagnetically coupled to the dielectric resonator 11 through the output coupling window 213. For the purpose of stabilized oscillation, the output matching circuit 41 may be structured as described above but for the purpose of compactness, alternatively it may be adapted such that a high frequency component as leaked from the output matching circuit 41 be electromagnetically coupled directly to the dielectric resonator 11 through the output coupling window 213. A portion of the resonance power of the dielectric resonator 11 is picked up by the coupling loop 51 and is fedback to the input impedance matching circuit 42 through the coaxial cable 5.

By selecting the length of the coaxial cable 5 such that the phase may be adjusted to attain a positive feedback when a portion of the resonance power of the dielectric resonator 11 is fedback to the field effect transistor 40 and the amplification degree of the amplifier 40 is larger than the attenuation degree of the feedback loop, oscillation is caused by the oscillator. The attenuation degree of the feedback loop becomes minimum in the vicinity of the resonance frequency of the dielectric resonator 11. By adjusting the above described minimum attenuation degree so as to be slightly smaller than the amplification degree of the amplifier 40, (i.e. by making the feedback gain positive, by changing the size of the opening of the output coupling window 213 and the length of the coupling loop 51), the frequency meeting the oscillating condition of the oscillator is narrowly restricted. Accordingly, the oscillator causes an oscillation in the vicinity of the resonance frequency of the dielectric resonator 11.

Figure 3B:
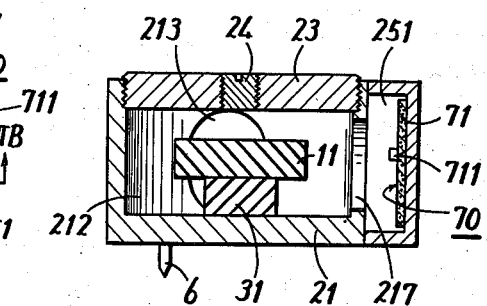
FIG. 3B is another cross sectional view of the FIG. 3A oscillator taken along the line IIIB—IIIB in FIG. 3A.

FIG. 3A is a view showing a transverse cross sectional view of another embodiment of the present invention and FIG. 3B is a view showing a cross section taken along the line IIIB—IIIB in FIG. 3A. The embodiment shown in FIGS. 3A and 3B is substantially the same as the embodiment shown in FIGS. 2A and 2B, except for the following respects. More specifically, an input coupling window 217 is formed on the second side surface of the first casing portion 21 which is adjacent to the first side surface where the output coupling window 213 is formed. The second casing portion 25 is formed in an L shape so as to cover the two adjacent first and second side surfaces of the first casing portion 21. A groove or a space 251 is formed along these two side surfaces and a stripline 70 is mounted in the space 251, i.e. on the inner surface of the second casing portion 25. The stripline 70 comprises an insulating substrate 71 (for example, ceramic) and a strip conductor 711 formed on the substrate 71. One end of the strip conductor 711 of the microstrip line 70 is connected to the input matching circuit 42 and the other end of the strip conductor 711 is connected to the second casing portion 25. Meanwhile, the other end of the strip conductor 711 may be opened or may be terminated with a resistor.

With such an oscillator structure, the output of the amplifier 40 is coupled through the output coupling window 213 to the dielectric resonator 11. On the other hand, the input of the amplifier 40 is electromagnetically coupled to the dielectric resonator 11 by means of the input coupling window 217 and the stripline 70 or the strip conductor 711. The phase adjustment is made by adjusting the length of the strip conductor 711.

Figure 4A:
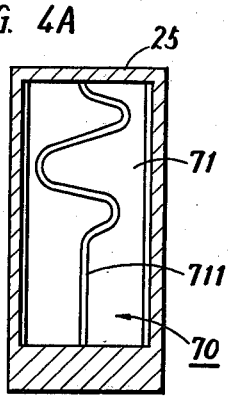
FIGS. 4A to 4D are views showing different examples of a stripline.

FIGS. 4A to 4D are views showing one example of a phase adjusting means for adjusting the phase by changing the length of the strip conductor. An example shown in FIG. 4A is structured to lengthen the length of the strip conductor 711 by making the same extend in a zigzag fashion. The end of the strip conductor 711 of the stripline 70 close to the input coupling window 217 is connected to the ground or short circuited.

Figure 4B:
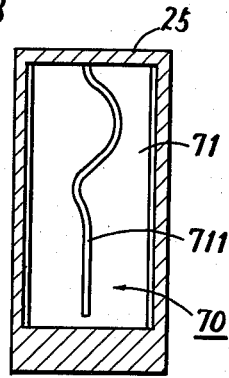

An example shown in FIG. 4B is adapted such that the end of the strip conductor 711 of the stripline 70 is open.

Figure 4C:
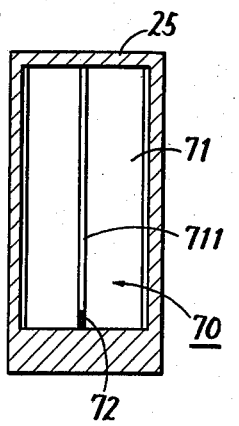

An example shown in FIG. 4C is structured such that the strip conductor 711 of the stripline 70 is linear and the end thereof is connected to the second casing portion 25 through a matching resistor 72. By connecting the input of the amplifier 40 to ground by the matching resistor 72, the resonance power from the dielectric resonator 11 is applied to the amplifier 40 through the stripline 70 and is grounded through the resistor 72, thereby eliminating both a reflective wave and a standing wave. Phase adjustment is made by changing the position of the input coupling window 217 in the example shown. Meanwhile, when the input of the amplifier 40 is grounded through the matching resistor 72, the attenuation of the feedback loop is increased and therefore the gain of the amplifier 40 need be increased accordingly.

Figure 4D:
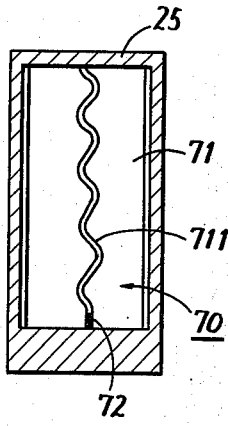

An example shown in FIG. 4D is structured such that the strip conductor 711 of the stripline 70 is uniformly curved in a zigzag fashion and the end thereof is grounded by the matching resistor 72. By uniformly curving the strip conductor 711 of the stripline 70 in a zigzag fashion, phase adjustable range attained by displacement of the input coupling window 217 is broadened.

Phase adjustment performed by curving the strip conductor 711 of the stripline 70 in a zigzag fashion and changing the length of the line and phase adjustment performed by changing the location of the input coupling window 217 are a form of rough adjustment, which is determined in advance in designing the oscillator. However, furthermore fine adjustment of the phase may be required in order to correct diversified phase characteristics of the amplifier 40 being used, structural differences caused in assemblage, designing errors and the like.

Figure 5A:
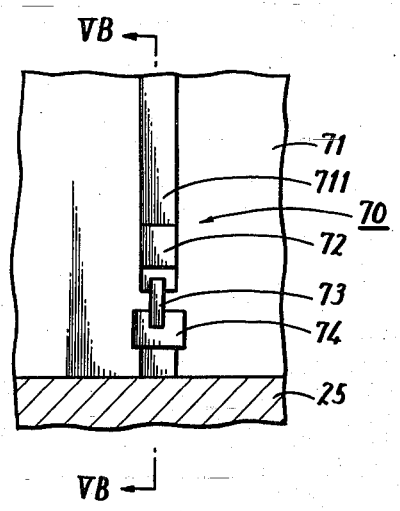
FIG. 5A is an enlarged view showing one example of a phase adjusting means.
Figure 5B:
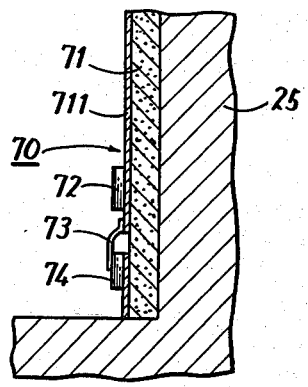
FIG. 5B is a view showing a cross section taken along the line VB—VB in FIG. 5A.

FIG. 5A is a view showing a major portion of another example of a phase adjusting means and FIG. 5B is a view showing a cross section taken along the line VB—VB in FIG. 5A. In the embodiment shown in FIGS. 5A and 5B, a matching resistor 72 is connected to the strip conductor 711 of the stripline 70 and the matching resistor 72 is connected to the ground through a capacitor 74. To that end, a chip like capacitor 74 and a matching resistor 72 are connected by means of a metallic piece 73 of such as gold, silver or the like. In the embodiment shown in FIGS. 5A and 5B, phase adjustment is made by adding a static capacitance to the strip conductor 711. Accordingly, a variable capacitor may be used as the capacitor 74.

Figure 6A:
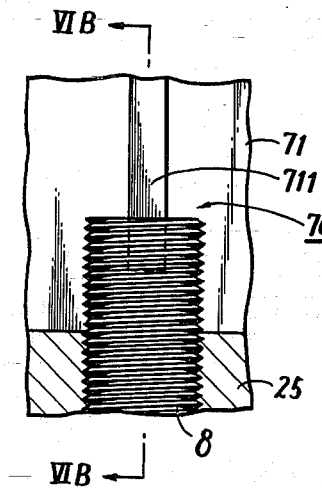
FIG. 6A is an enlarged view showing a major portion of another embodiment of a phase adjusting means.
Figure 6B:
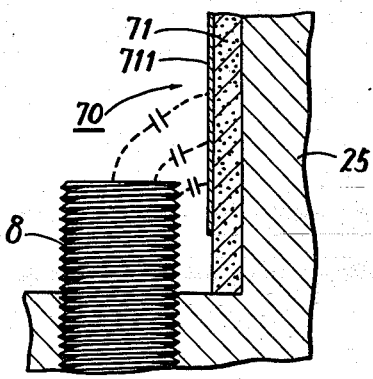
FIG. 6B is a view showing a cross section taken along the line VIB—VIB in FIG. 6A.

FIG. 6A is a view showing a major portion of a further example of a phase adjusting means and FIG. 6B is a view showing a cross section taken along the line VIB—VIB in FIG. 6A. In the embodiment shown in FIGS. 6A and 6B, a screw 8 is screwed to the second casing portion 25 at the end of the strip conductor 711 of the stripline 70, so that a static capacitance between the screw 8 and the strip conductor 711 of the stripline 70 may be varied by turning the screw 8 to move toward or away from the space 251. Therefore, the embodiment shown makes it possible to adjust the phase from outside the casing. Alternatively, phase may be adjusted by varying a static capacitance between the phase adjusting screw 8 and the strip conductor 711 of the stripline 70 by filling epoxy resin, for example, between the screw 8 and the microstrip line 70 and by changing an amount of the epoxy resin. In such a case, the epoxy resin also serves to lock the screw 8.

FIG. 7A is a view showing a major portion of a still further embodiment of a phase adjusting means and FIG. 7B is a view showing a cross section taken along the line VIIB—VIIB in FIG. 7A. The embodiment shown comprises a pin 75 connected to the end of the strip conductor 711 of the stripline 70. An insulating bushing 92 formed with an aperture 91 through which pin 75 is inserted is mounted in the phase adjusting screw 9 which is screwed to the second casing portion 25. The insulating bushing 92 is made of Teflon (trademark), for example. Phase adjustment is made by turning the screw 9, thereby to change the position of the insulating bushing 92 inserted between the pin 75 and the phase adjusting screw 9, so that a static capacitance of the strip conductor 711 may be changed.

FIG. 8 is a view showing a cross section of still a further embodiment of the present invention. The embodiment shown in FIG. 8 comprises a combination of the embodiment shown in FIGS. 3A and 3B and the embodiment shown in FIGS. 7A and 7B, wherein the pin 75 also serves as an exciting bar. The strip conductor 711 of the stripline 70 is structured as shown in FIGS. 4A to 4D and the phase is roughly adjusted in advance. The pin 75 is slidably supported through the bushing 92, for example, in the phase adjusting screw 9. The tip end of the pin 75 extends above the strip conductor 711 of the stripline 70. Accordingly, the phase is fine adjusted by turning the phase adjusting screw 9, so that the screw may be displaced in the length direction of the strip conductor 711. Meanwhile, in the FIG. 8 embodiment, the stripline 70 may be replaced by a coaxial cable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oscillator using a dielectric resonator, comprising:
   a casing made of an electrically conductive material and having a wall defining a space therein;
   a dielectric resonator disposed within said space;
   amplifying means disposed outside said wall and including an input circuit and an output circuit;
   input coupling means associated with said input circuit for coupling said input circuit and said dielectric resonator through said wall; and
   output coupling means associated with said output circuit for coupling said output circuit and said dielectric resonator through said wall, said output coupling means comprising an output coupling window formed in said wall and positioned with respect to said output circuit at a location which permits propagation of a predetermined amount of an electromagnetic wave from said output circuit to said dielectric resonator.

2. An oscillator in accordance with claim 1, wherein said amplifying means comprises an amplifying element, and said output circuit comprises a strip conductor connected to the output of said amplifying element.

3. An oscillator in accordance with claim 2, wherein said aforementioned wall is a first wall and said aforementioned space is a first space and further comprising a second wall formed in said casing, said second wall cooperating with said first wall to define a second space located outside said first space, said amplifying element and said strip conductor being located within said second space.

4. An oscillator in accordance with claim 3, wherein an aperture is formed in said first wall; said input coupling means comprises a coaxial line having an inner conductor; one end of said inner conductor of said coaxial line is connected to said input circuit, and the other end of said inner conductor of said coaxial line is extended within said first space through said aperture.

5. An oscillator in accordance with claim 1 or 2, wherein: an aperture is formed in said wall; said input coupling means comprises a coaxial line having an inner conductor; one end of said inner conductor of said coaxial line is connected to said input circuit; and the other end of said inner conductor of said coaxial line is extended within said space through said aperture.

6. An oscillator in accordance with claim 5, wherein the other end of said inner conductor of said coaxial line extended within said space is formed in a loop shape.

7. An oscillator in accordance with claim 5, further including phase adjusting means associated with said coaxial line for adjusting the phase of a signal in said coaxial line.

8. An oscillator in accordance with claim 1, 2 or 3, wherein said input coupling means comprises an input coupling window located with respect to the said input circuit at a position which will allow propagation of a predetermined amount of an electromagnetic wave from said dielectric resonator to said input circuit.

9. An oscillator in accordance with claim 8, wherein said input coupling means comprises a leakage line having one end connected to said input circuit, whereby an electromagnetic wave from said dielectric resonator is coupled to said leakage line through said input coupling window.

10. An oscillator in accordance with claim 9, wherein said leakage line comprises a strip conductor.

11. An oscillator in accordance with claim 10, wherein said strip conductor is formed in a zigzag shape at least at a length directional portion.

12. An oscillator in accordance with claim 10, further comprising phase adjusting means associated with said strip conductor for adjusting the phase of a signal in said strip conductor.

13. An oscillator in accordance with claim 12, wherein said phase adjusting means is adapted to vary the electrical length of said strip conductor.

14. An oscillator in accordance with claim 12, wherein said phase adjusting means comprises a matching resistor connected to the other end of said strip conductor.

15. An oscillator in accordance with claim 12, wherein said phase adjusting means comprises capacitance means coupled to said strip conductor.

16. An oscillator in accordance with claim 15, wherein said capacitance means comprises variable capacitance means.

17. An oscillator in accordance with claim 10, wherein an exciting bar is coupled to the other end of said strip conductor.

18. An oscillator in accordance with claim 10, wherein said aforementioned wall is a first wall, said aforementioned space is a first space and further comprising a second wall formed outside said first wall for defining a second space together with a portion of said first wall, and wherein said strip conductor is formed on the inner surface of said second wall within said second space.

19. An oscillator in accordance with claim 18, further comprising a screw attached to said second wall in the vicinity of said strip conductor and adapted to be movable toward or away from said strip conductor.

20. An oscillator in accordance with claim 19, further comprising an exciting bar coupled to the other end of said strip conductor.

21. An oscillator in accordance with claim 20, wherein said screw is made of an electrically conductive material, and said exciting bar is slidably mounted within said screw through an insulating material.

22. An oscillator in accordance with claim 1, 2 or 3, further comprising a lid member mounted so as to be movable toward or away from said dielectric resonator for adjusting the oscillation frequency of said oscillator.

23. An oscillator in accordance with claim 22, further comprising a screw member attached to said lid member so as to be movable toward or away from said dielectric resonator so as to provide fine adjustment of the oscillation frequency of said oscillator.

24. An oscillator in accordance with claim 11 further comprising phase adjusting means associated with said strip conductor for adjusting the phase of a signal in said strip conductor.

25. An oscillator in accordance with claim 24, wherein said phase adjusting means is adapted to vary the electrical length of said strip conductor.

26. An oscillator in accordance with claim 24, wherein said phase adjusting means comprises a matching resistor connected to the other end of said strip conductor.

27. An oscillator in accordance with claim 24, wherein said phase adjusting means comprises a capacitance means coupled to said strip conductor.

28. An oscillator in accordance with claim 27, wherein said capacitance means comprises a variable capacitor.

29. An oscillator in accordance with claim 5, further comprising a lid member mounted so as to be movable toward or away from said dielectric resonator for adjusting the oscillation frequency of said oscillator.

30. An oscillator in accordance with claim 21, further comprising a lid member mounted so as to be movable toward or away from said dielectric resonator for adjusting the oscillation frequency of said oscillator.

* * * * *